United States Patent
Azenkot et al.

(10) Patent No.: US 8,660,216 B2
(45) Date of Patent: Feb. 25, 2014

(54) METHOD AND APPARATUS FOR MITIGATING THE RESIDUAL CFO EFFECT ON CHANNEL ESTIMATION FOR OFDM RECEIVERS

(75) Inventors: Yehuda Azenkot, San Jose, CA (US); Zvi Bernstein, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 602 days.

(21) Appl. No.: 12/909,816

(22) Filed: Oct. 21, 2010

(65) Prior Publication Data

US 2011/0293032 A1 Dec. 1, 2011

Related U.S. Application Data

(60) Provisional application No. 61/349,855, filed on May 29, 2010.

(51) Int. Cl.
*H03D 1/00* (2006.01)
*H04L 27/06* (2006.01)

(52) U.S. Cl.
USPC .................................................. 375/340

(58) Field of Classification Search
USPC ......... 375/231, 232, 260, 321, 326, 340, 341, 375/342, 343, 344, 346, 350, 354
See application file for complete search history.

(56) References Cited

U.S. PATENT DOCUMENTS

| | | | |
|---|---|---|---|
| 2002/0176483 A1* | 11/2002 | Crawford | 375/137 |
| 2005/0058193 A1* | 3/2005 | Saed | 375/232 |
| 2006/0140308 A1* | 6/2006 | MacFarlane Shearer et al. | 375/326 |
| 2010/0239033 A1* | 9/2010 | Shiue et al. | 375/260 |
| 2011/0002425 A1* | 1/2011 | Gong | 375/344 |

* cited by examiner

*Primary Examiner* — Sam K Ahn
*Assistant Examiner* — Syed Haider

(57) ABSTRACT

A CFO tracking loop module comprises: a numerically-controlled oscillator (NCO) that calculates a phase output; a CFO phase error block that generates a corrected NCO phase output by subtracting half of residual CFO phase error from the NCO phase output; a multiplier that corrects pilot subcarrier's phase by multiplying complex values of the pilot subcarriers by a conjugated complex value of the corrected NCO phase output; a pilot processor that generates a phase error by averaging phases over pilot subcarriers; and a loop filter that filters phase error from the pilot processor and updates the NCO with the filtered phase error.

16 Claims, 4 Drawing Sheets

METHOD AND APPARATUS FOR MITIGATING THE RESIDUAL CFO EFFECT ON CHANNEL ESTIMATION FOR OFDM RECEIVERS

PRIORITY REFERENCE TO PRIOR APPLICATION

This application claims benefit of and incorporates by reference U.S. patent application Ser. No. 61/349,855, entitled "Mitigating the Residual CFO Effect on Channel Estimation for OFDM Receivers," filed on May 29, 2010, by inventors Yehuda Azenkot et al.

TECHNICAL FIELD

This invention relates generally to receivers and more particularly, but not exclusively, provides a method and apparatus for mitigating Carrier Frequency Offset (CFO) effect on channel estimation.

BACKGROUND

A channel estimation process estimates a channel transfer function (CTF) at each subcarrier. The channel estimation is based on two special symbols called Channel Estimation (CE), which are part of a preamble of each packet.

A PHY preamble is attached to a beginning of every transmitted PHY payload. The preamble includes reference signals which can be useful to facilitate receivers in detecting and acquiring physical layer parameters required to properly decode the packet, such as gain, frequency-offset, timing information and channel estimation.

The PHY preamble usually has 3 consecutive sequences:
1. A Short Sequence, which has 0 or 12 repetitions of a Short-Symbol (SS), which can be useful to facilitate convergence of the receiver's AGC setting.
2. A Long Sequence (LS), which has 0, 4 or 8 repetitions of a Long-Symbol, which can be useful to facilitate recovery by the receiver of timing and frequency-offset information.
3. The Channel Estimation Sequence, which has 2 repetitions of a CE-Symbol and is useful to facilitate the receiver's estimation of Channel Transfer Function (CTF). The receiver equalizer coefficients are obtained from the inverse of the CTF coefficients.

The arrival of a packet is detected via the LS of the preamble. Then, the CFO and possibly the Sampling Frequency Offset (SFO) are estimated using also the LS of the preamble and corrected. The CFO and SFO are generated due to the frequency offsets between the transmitter and the receiver local RF oscillators (LOs) and the sampling clock, respectively. The CFO and sometimes the SFO are estimated and corrected before the channel is estimated. However, the residual CFO may be too large causing degradation to the accuracy of the channel estimation, which may be significant for systems that use high constellations such as 1024-QAM and 4096-QAM as are used in MoCA and G.hn, respectively.

The residual CFO, which is the left-over CFO after estimating the CFO using the LS, affects the estimated channel transfer function (CTF) and the equalizer coefficients. This residual CFO can be estimated via the CE sequence. However, since the derived residual CFO (from the CE sequence) is obtained after the FFT of the CE sequence, it cannot be used to correct the CE before the FFT is applied for the use of the Channel Estimator/EQ block. In this work we show the effect of the residual CFO on the estimated equalizer coefficients and suggest how to use the estimated residual CFO based on the CE sequence to mitigate the affected estimated equalizer coefficients.

The received CE after FFT at a k-th tone of an n-th symbol is given by:

$$X_{n,k} = H_{n,k} \cdot s_{n,k} + N_{n,k}, \quad \text{Equation 1}$$

where:
$H_{n,k}$ is the frequency response of the k-th tone for symbol n,
$s_{n,k}$ is the signal modulating the k-th subcarrier (tone) of the n-th symbol and is known at the receiver,
$N_{n,k}$ is additive white Gaussian noise (AWGN) at the k-th subcarrier of the n-th symbol,
k is the frequency index from $-N/2$ to $N/2-1$,
N is the number of the FFT samples.

It's assumed that the channel $H_{n,k}$ does not change from symbol to symbol within a packet and is a function of the subcarrier index k only. Since the signals modulating the subcarriers of the two CE symbols, $s_k$, are the same, the received two CE symbols for n=1 and 2 are given by:

$$X_{1,k} = H_k \cdot s_k + N_{1,k}$$

$$X_{2,k} = H_k \cdot s_k + N_{2,k} \quad \text{Equation 2}$$

The channel estimation is obtained from the two identical training sequences called CE, which are part of the preamble. The standard channel estimation is done as follows:

Averaging of the two CE symbols after being converted to the frequency domain $$Y_k = (X_{1,k} + X_{2,k})/2 \quad \text{Equation 3}$$

The least squares estimation of the channel frequency response per subcarrier is given by $$H_k^{LS} = \frac{Y_k}{s_k} \quad \text{Equation 4}$$

The channel frequency response estimate can be improved by using the frequency domain correlation and the time domain correlation of the channel frequency response. The improved channel frequency response is generally a linear combination of the least squares channel coefficients, $H_k^{LS}$. As is shown later, the phase error of the channel coefficients due to the residual CFO is fixed per subcarrier; thus, the improvement of the channel estimate is not affected by the fixed phase error.

The equalizer coefficients, $Q_k$, per each subcarrier k are estimated via $$Q_k = \frac{1}{H_k^{LS}} \quad \text{Equation 5}$$

The residual CFO causes phase and gain errors on the channel estimation.

Assuming the phase difference between the two CE symbols due to the residual CFO is $\phi$ radians. Then, the received samples of the two CE symbols in the frequency domain are given by:

$$X_{1,k} = e^{-j \cdot \phi} \cdot H_k \cdot s_k + N_{1,k}$$

$$X_{2,k} = H_k \cdot s_k + N_{2,k} \quad \text{Equation 6}$$

Note that it is assumed that the phase of the 2nd CE symbol is 0 and the previous CE symbol is related to the second CE symbol. The channel estimation and the equalizer coefficients are related to the second CE symbol which is just before the arrival of the data symbols.

Averaging of the two CE symbols gives:

$$Y_k = (X_{1,k} + X_{2,k})/2$$

After ignoring the noise:

$$Y_k = (e^{-j\phi} \cdot H_k \cdot s_k + H_k \cdot s_k)/2$$

$$Y_k = \frac{1 + e^{-j\phi}}{2} \cdot H_k \cdot s_k$$

The least squares estimate of the channel frequency response per subcarrier is given by:

$$H_k^{LS(1)} = \frac{Y_k}{s_k} \quad \text{Equation 7}$$

$$H_k^{LS(1)} = \frac{1 + e^{-j\phi}}{2} \cdot H_k \quad \text{Equation 8}$$

Therefore, the channel estimation can be presented by:

$$H_k^{LS(1)} = G \cdot e^{j \cdot \Delta\Phi} \cdot H_k$$

where, the gain and phase distortions of the channel frequency response estimation are G and $\Delta\phi$, respectively.

$$H_k^{LS(1)} = \frac{e^{-j\phi/2} \cdot (e^{j\phi/2} + e^{-j\phi/2})}{2} \cdot H_k = e^{-j\phi/2} \cdot \cos(\phi/2) \cdot H_k$$

The residual CFO causes a gain distortion of $\cos(\phi/2)$ and phase distortion of $-\phi/2$ on the channel estimation for every subcarrier. Note that the phase distortion of the channel transfer function estimate is only half of the residual CFO phase error in radian because the channel estimate averages the two CE symbols, where only the first one has the CFO phase error. The phase error of the estimated channel transfer function is fixed for all the frequency indexes.

The gain distortion can be approximated by $$\cos(\phi/2) \approx 1 - \frac{\phi^2}{8} \approx 1, \quad \phi \ll 1$$

The gain error of the channel transfer function due to the residual CFO phase error of one OFDM symbol is related to the square of the residual CFO phase error over one symbol while the phase error is related to the CFO phase. Therefore, the gain distortion is usually small and can be ignored. If the gain error is significant, a gain correction can be added.

The approximated channel transfer function estimation is given by:

$$H_k^{LS(1)} \approx e^{-j\phi/2} \cdot H_k$$

The equalizer coefficients, $Q_k$, per each subcarrier k are given by:

$$Q_k = \frac{1}{H_k^{LS}} \quad \text{Equation 9}$$

$$Q_k \approx e^{j\phi/2} \cdot \frac{1}{H_k}$$

The estimated equalizer coefficient per subcarrier has a constant phase error equals to half of the residual CFO phase error over one OFDM symbol.

Accordingly, a new apparatus and method are needed to mitigate CFO to achieve optimal receiver performance.

SUMMARY

A CFO tracking loop module that mitigates CFO comprises: a numerically-controlled oscillator (NCO) that calculates a phase output; a CFO phase error block that generates a corrected NCO phase output by subtracting half of residual CFO phase error from the NCO phase output; a multiplier that corrects pilot subcarrier's phase by multiplying complex values of the pilot subcarriers by a conjugated complex value of the corrected NCO phase output; a pilot processor that generates a phase error by averaging phases over pilot subcarriers; and a loop filter that filters phase error from the pilot processor and updates the NCO with the filtered phase error.

A method of mitigating CFO comprises: calculating phase output; generating a corrected phase output by subtracting half of residual CFO phase error from the phase output; correcting pilot subcarrier's phase by multiplying complex values of the pilot subcarriers by a conjugated complex value of the corrected phase output; generating a phase error by averaging phases over pilot subcarriers; and filtering phase error from the pilot processor and updates the NCO with the filtered phase error.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
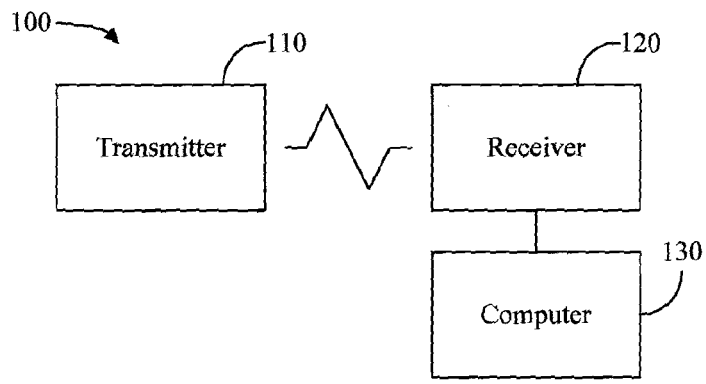
FIG. 1 is a block diagram illustrating a network system.

FIG. 1 is a block diagram illustrating a network system 100. The system 100 comprises a transmitter 110, a receiver 120 and a device (e.g., computer, set top box, digital video recorder, etc.) 130. The transmitter is communicatively coupled, wired or wirelessly, to the receiver 120, which is in turn communicatively coupled, wired or wirelessly, to the device 130. The transmitter 110 transmits an analog signal to the receiver 120, which converts the analog signal into a digital signal for the device 130.

Figure 2:
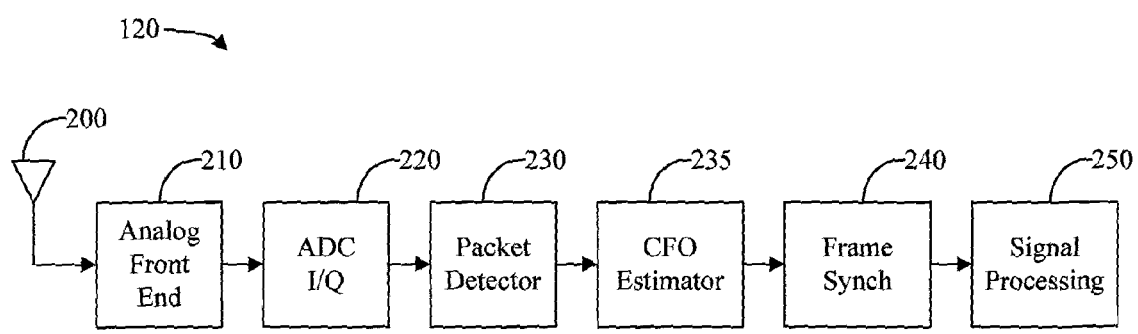
FIG. 2 is a block diagram illustrating a receiver according to an embodiment of the invention.

FIG. 2 is a block diagram illustrating the receiver 120 according to an embodiment of the invention. A signal enters a receiving block 200 (e.g., receiving antenna or cable, etc.), which is coupled to an analog front end 210. The analog front end 210 produces in-phase and quadrature (I/Q) signals which enter an analog-to-digital converter (ADC) 220. The ADC 220 is coupled to a packet detector 230 that detects the presence of a packet and establishes symbol boundaries. The packet detector 230 is coupled to a CFO estimator 235, which is coupled to a frame synchronization block 240. The estimator 235 finds the CFO based on the LS of the preamble and later also based on the CE sequence. After frame synchronization is established, the signal enters a signal processing block 250, which can include such functions as Fast Fourier Transform (FFT), channel equalization, and decoding in an embodiment. The output of this block 250 is the decoded data.

Figure 3:
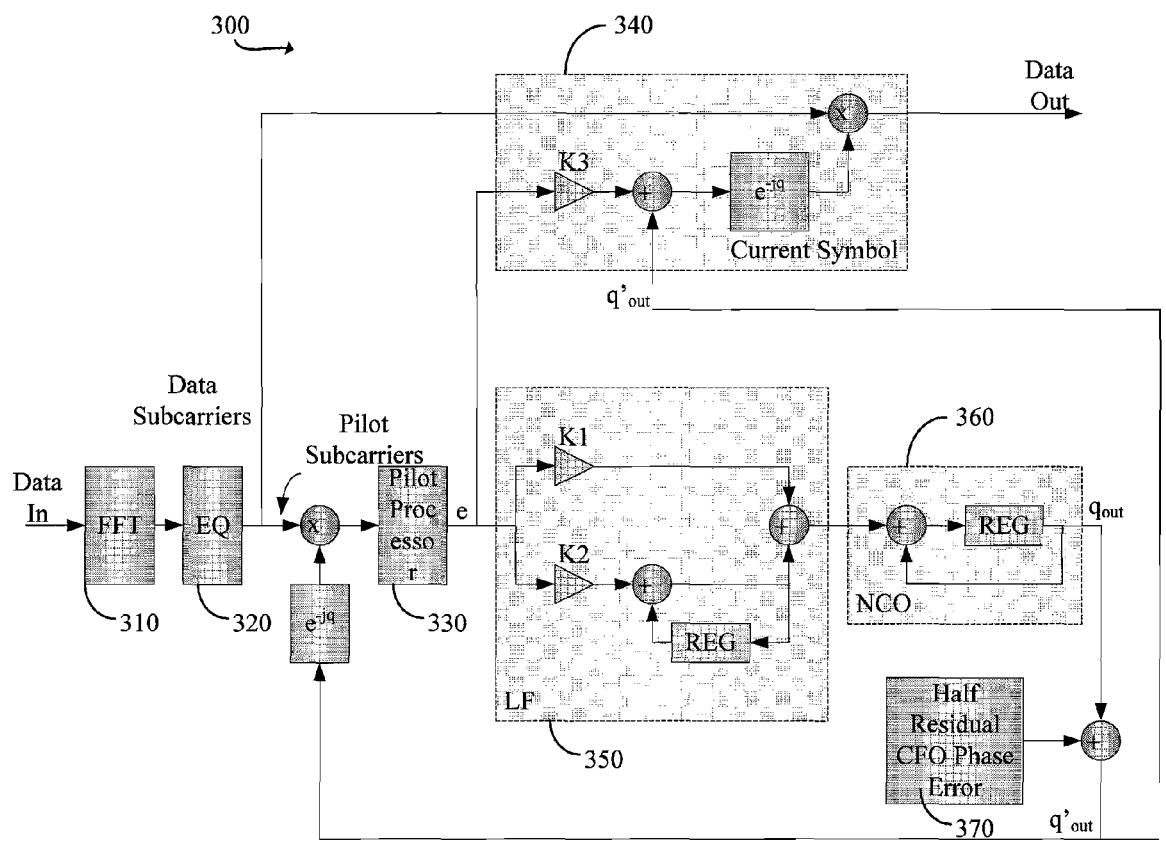
FIG. 3 is a block diagram illustrating a CFO tracking loop module according to an embodiment of the invention.

FIG. 3 is a block diagram illustrating a CFO tracking loop module 300 according to an embodiment of the invention. The module 300 is part of the signal processing block 250 (FIG. 2). The module 300 comprises a fast Fourier transform (FFT) 310 coupled to an equalizer (EQ) 320. The EQ 320 is coupled to a multiplier that multiples complex values of the pilot subcarriers by numerically controlled oscillator (NCO) 360 phase output. The result is fed into a pilot processor 330, which determines the phase error by averaging the phases over the input pilot subcarriers.

$$\epsilon = \arg(\Sigma r_k) \qquad \text{Equation 10}$$

where arg( ) is the phase of the complex value, and $r_k$ are the input complex values of the pilot subcarriers. Coupled to the pilot processor 330 is a loop filter (LF) 350, which filters the phase error, $\epsilon$. Coefficients k1 and k2 of the LF 350 are programmable values.

$$LFout = k1 \cdot \epsilon + k2 \cdot \epsilon + REG$$

$$REG(n+1) = k2 \cdot \epsilon + REG(n)$$

Coupled to the LF 350 is the NCO 360, which is updated by the LF 350 output $$NCO\_REG(n+1) = LFout + NCO\_REG(n)$$

The NCO 360 phase output in one embodiment is corrected by half of the residual CFO phase error 370.

A "Current Symbol" block 340, which is coupled to the pilot processor 330, corrects all the data subcarrier phases according to the corrected NCO phase output and the phase error, $\epsilon$.

Accordingly, the erroneous phases of the equalizer coefficients are left uncorrected. Instead of correcting the equalizer coefficients, the phase of half of the residual CFO error (determined by the CFO estimator 235) is added to the phase of the NCO 360 of module 300. This correction causes the PLL not to correct the equalizer phase error. The corrections of the data subcarriers are done according to the corrected NCO 360 output, $\theta'$out.

The residual CFO error (also referred to as CFO phase error or just CFO) is estimated based on the CE sequence. It is not the same as the phase error found via the pilot processor.

The CFO is estimated based on 3 different inputs. Note that the 3 CFO estimations are performed sequentially in time.
1. Using the LS
2. Using the CE
3. Using the pilot subcarriers of the data OFDM symbols Note that the receiver receives first LS, then CE, and later one or more data OFDM symbols.

Initially, the CFO is estimated using the LS. Then, the CFO is used to correct the frequency offset of the received signal via the Frequency Offset Correction block. Then, after correcting the frequency offset of the CE, the (Channel Transfer Function and) the EQ coefficients are found using the CE. The EQ coefficients are not completely accurate due to the residual CFO Phase Error that is due to the inaccuracy of the CFO based on LS (residual CFO phase Error).

In an embodiment, there is another step of CFO estimation based on the CE. This CFO estimation (based on CE) is obtained after getting the EQ coefficients. An embodiment improves the EQ coefficients accuracy by using the CFO estimation (based on CE). Note that the EQ coefficients are not perfect because the frequency offset correction performed on the CE has some residual phase error because the CFO obtained based on LS has some residual phase error (like any estimator). Embodiments of the invention have 3 methods to mitigate the inaccurate EQ coefficients. The 3 methods use the CFO based on the CE. The 3 methods update the PLL.

Then, later in time, the PLL starts processing the data OFDM symbol(s) received after the CE. The PLL uses the CFO based on the pilot subcarriers. The pilot subcarriers are available in the data OFDM symbols received after the CE. The pilot subcarriers are some of the subcarriers of OFDM symbols.

The module 300 processes the pilot subcarriers. Note that the MoCA standard does not define specific subcarriers to be pilot subcarriers as is done in other standards such as Wi-Fi 802.11a. Therefore, in an embodiment, the subcarriers that have higher Signal to Noise Ratio (SNR) are nominated to be the pilot subcarriers. Typically, about 128 subcarriers are designated as pilot subcarriers. The transmit data of the designated pilot subcarriers is obtained at the receiver via a slicer operation.

Figure 4:
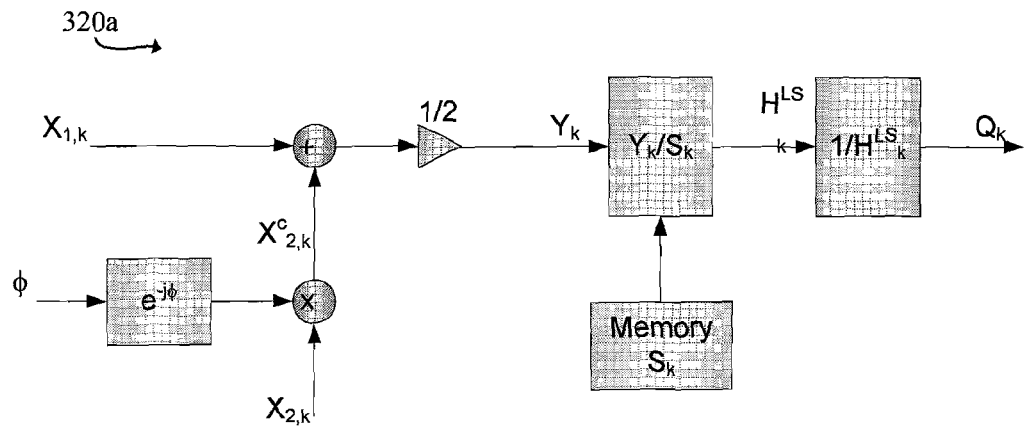
FIG. 4 is a block diagram illustrating an equalizer coefficients module according to an embodiment of the invention.

FIG. 4 is a block diagram illustrating a modified EQ 320a for use in the CFO tracking loop module 300 according to an embodiment of the invention. The module 320a is located in the module 300 and operates after the FFT 310. The modified EQ module 320a adds an additional step of removing the phase generated due to the residual CFO before the averaging of the two CE symbols step mentioned above. Note that in this embodiment, where the modified EQ 320a is used, block 370 may be disabled. The de-rotated second CE samples, $X^c_{2,k}$, is given by $$X^c_{2,k} = e^{-j\cdot\phi} \cdot X_{2,k}$$

The de-rotation requires the de-rotation of N samples of the second CE symbol. The phase, $\phi$ is the phase due to the residual CFO that is obtained from the 2 CE symbols, as is known to one of ordinary skill in the art.

In another embodiment, an EQ module averages the two CE symbols after being converted to the frequency domain and correcting the effect of the residual CFO error on the second CE symbol.

$$Y_k = (X_{1,k} + X^c_{2,k})/2 \qquad \text{Equation 11}$$

The module then performs a least squares estimation of the channel frequency response per subcarrier given by $$H_k^{LS} = \frac{Y_k}{S_k} \quad \text{Equation 12}$$

The tracking loop module 300 CFO is not affected by this method and the CFO Tracking Loop can be done via other methodologies.

Figure 5:
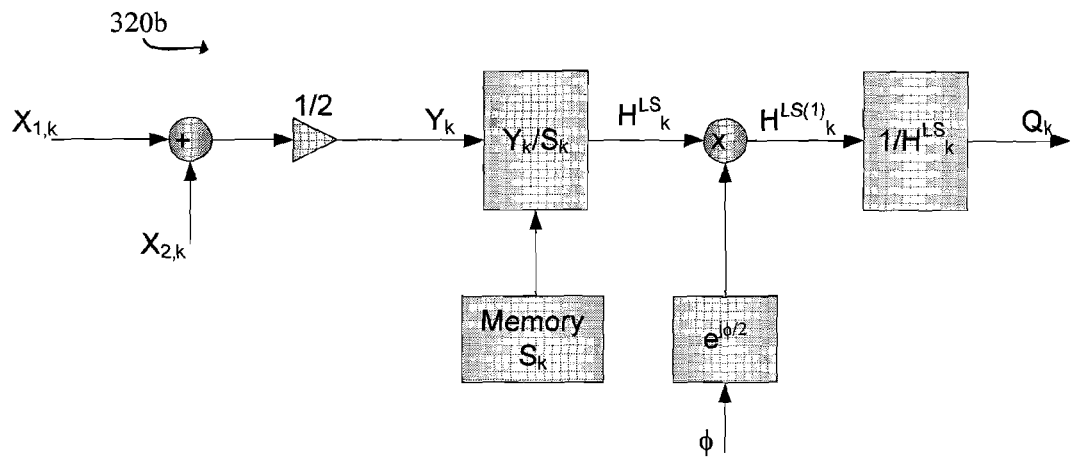
FIG. 5 is a block diagram illustrating a de-rotation module according to an embodiment of the invention.

FIG. 5 is a block diagram illustrating a modified EQ 320b for use in the CFO tracking loop module 300 according to an embodiment of the invention. Note that in this embodiment, where the modified EQ 320b is used, block 370 may be disabled. After obtaining the channel coefficients, the EQ 320b applies de-rotation of all the channel estimation coefficients. The de-rotation depends on the residual CFO.
The de-rotated channel coefficients are given by $$H_k^{LS(c)} \approx e^{j \cdot \phi/2} \cdot H_k^{LS(1)} \quad \text{Equation 13}$$

The EQ 320b then obtains the equalizer coefficients, $Q_k$, per each subcarrier k, which are estimated via $$Q_k = \frac{1}{H_k^{LS}} \quad \text{Equation 14}$$

Figure 6:
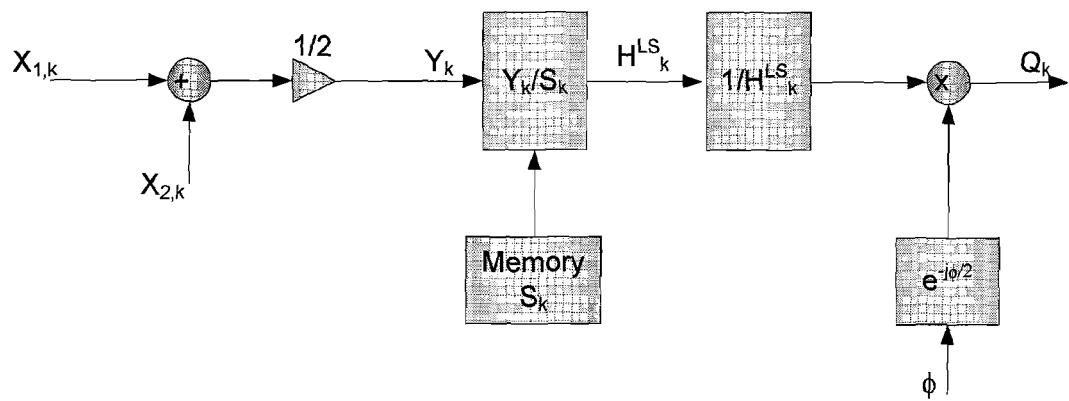
FIG. 6 is a block diagram illustrating a de-rotation module according to an embodiment of the invention.

FIG. 6 is a block diagram illustrating an EQ 320c for use in the CFO tracking loop module 300 according to an embodiment of the invention. Note that in this embodiment, where the modified EQ 320c is used, block 370 may be disabled. After obtaining the equalizer coefficients, the EQ 320c applies de-rotation to all the equalizer coefficients. The de-rotation depends on the residual CFO.

Correcting the uncorrected equalizer coefficients by de-rotation of the equalizer coefficients yields:

$$Q_k^c \approx e^{-j \cdot \phi/2} \cdot Q_k \quad \text{Equation 15}$$

The de-rotation requires the de-rotation of N samples.

Figure 7:
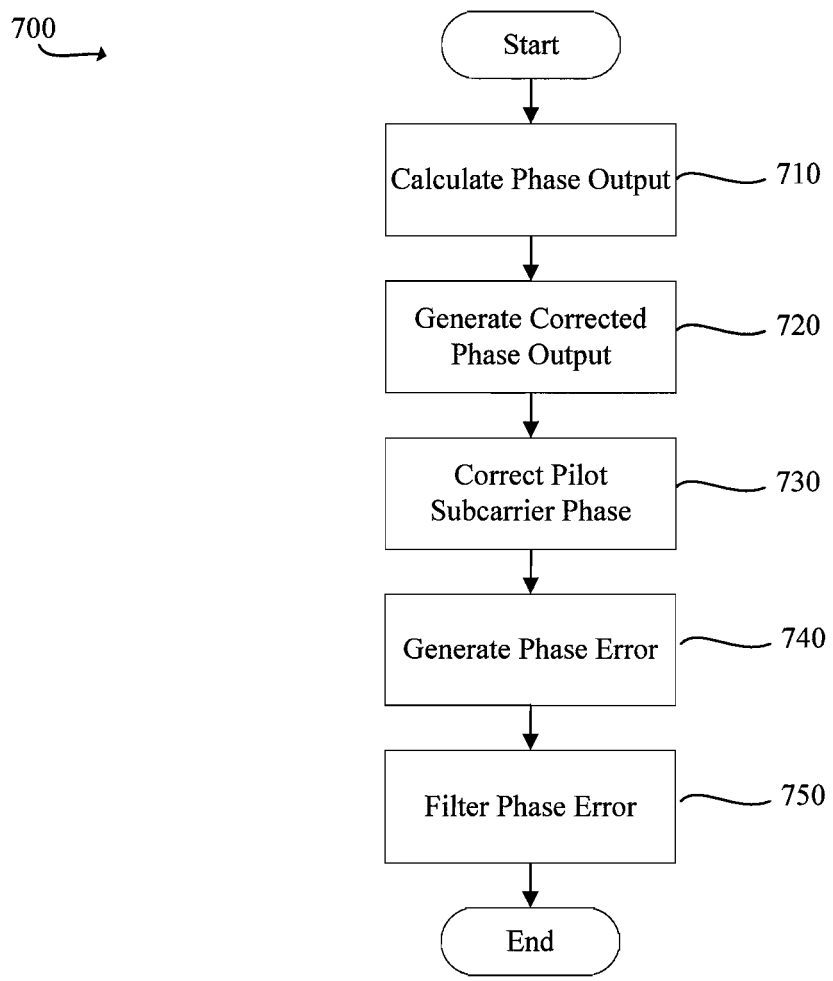
FIG. 7 is a flowchart illustrating a method of CFO correction.

FIG. 7 is a flowchart illustrating a method 700 of CFO correction. First, phase output is calculated (710). Then, a corrected NCO phase output is generated (720) by subtracting half of residual CFO phase error from the NCO phase output. Afterwards, a pilot subcarrier's phase is corrected (730) by multiplying complex values of the pilot subcarriers by a conjugated complex value of the corrected phase output. A phase error is generated (740) by averaging phases over pilot subcarriers. Phase error is filtered (750) from the pilot processor and updates the NCO with the filtered phase error. The method 700 then ends.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A carrier frequency offset (CFO) tracking loop module, comprising:
   a numerically-controlled oscillator (NCO) that calculates an NCO phase output;
   a CFO phase error block that generates a corrected NCO phase output by subtracting half of a residual CFO phase error from the NCO phase output;
   a pilot processor that generates a phase error by averaging phases of pilot subcarriers;
   a multiplier that corrects the pilot subcarrier's phase by multiplying complex values of the pilot subcarriers with a conjugated complex value of the corrected NCO phase output; and
   a loop filter that filters the phase error from the pilot processor and updates the NCO with the filtered phase error.

2. The module of claim 1, wherein a CFO phase error is estimated using a long sequence, the channel estimation sequence, and the pilot subcarriers, and
   wherein the residual CFO phase error is estimated using a channel estimation sequence and before a frame synchronization is performed.

3. The module of claim 1, further comprising an equalizer that performs channel estimation by removal of a CFO phase error before other estimation steps.

4. The module of claim 1, further comprising an equalizer that de-rotates channel estimation coefficients based on the residual CFO phase error.

5. A carrier frequency offset (CFO) tracking loop module, comprising:
   a numerically-controlled oscillator (NCO) that calculates a phase output;
   a CFO phase error block that generates a corrected NCO phase output by subtracting half of a residual CFO phase error from the NCO phase output;
   a pilot processor that generates a phase error by averaging phases over a plurality of pilot subcarriers;
   a multiplier that corrects the phase of the pilot subcarriers by multiplying a plurality of complex values of the pilot subcarriers by a conjugated complex value of the corrected NCO phase output;
   a loop filter that filters the phase error from the pilot processor and updates the NCO with the filtered phase error; and
   an equalizer that de-rotates channel estimation coefficients based on a CFO phase error;
   wherein the de-rotated channel estimation coefficients ($X_{2,k}^c$) are given by $$X_{2,k}^c \approx e^{-j \cdot \phi} \cdot X_{2,k},$$

where $\phi$ is the CFO phase error in radians, j is the imaginary unit, e is the base of the natural logarithm, and $\cdot X_{2,k}$ are the received channel estimation samples.

6. The module of claim 1, further comprising a plurality of subcarriers;
   wherein a first subcarrier having a higher Signal to Noise Ratio (SNR) than a second subcarrier is nominated to be a pilot subcarrier.

7. The module of claim 6, wherein a transmit data of the first subcarrier is obtained at a receiver via a slicer operation.

8. The module of claim 1, wherein the residual CFO phase error is estimated from two channel estimation symbols.

9. A method, comprising:
   calculating a phase output;
   estimating a residual carrier frequency offset (CFO) phase error using a channel estimation sequence;
   performing a frame synchronization after estimating the residual CFO phase error;
   generating a phase error by averaging a plurality of phases of a plurality of pilot subcarriers;

generating a corrected phase output by subtracting half of the residual CFO phase error from the phase output;

correcting the phase of the pilot subcarriers by multiplying a plurality of complex values of the pilot subcarriers by a conjugated complex value of the corrected phase output;

filtering the phase error from the pilot processor; and updating a numerically-controlled oscillator (NCO) with the filtered phase error.

10. The method of claim 9, wherein the phase error is estimated using a long sequence, the channel estimation sequence and the pilot sub carriers.

11. The method of claim 9, further comprising performing channel estimation by removal of the phase error before other estimation steps such that the subtracting is not performed.

12. The method of claim 9, further comprising de-rotating channel estimation coefficients based on the phase error such that the subtracting is not performed.

13. The method of claim 12, wherein the de-rotated channel estimation coefficients ($X_{2,k}^c$) are given by $$X_{2,k}^c = e^{-j\phi} \cdot X_{2,k},$$

where $\phi$ is the phase error in radians, j is the imaginary unit, e is the base of the natural logarithm, and $\cdot X_2$ k are the received channel estimation samples.

14. The method of claim 9, further comprising nominating a first subcarrier having higher a Signal to Noise Ratio (SNR) than a second subcarrier to be a pilot subcarrier.

15. The method of claim 14, further comprising slicing, at a receiver, the first subcarrier to generate a transmit data.

16. The method of claim 9, wherein the residual CFO phase error is estimated from two channel estimation symbols.

* * * * *